(12) United States Patent
Chatwin

(10) Patent No.: US 6,583,671 B2
(45) Date of Patent: Jun. 24, 2003

(54) STABLE AGC TRANSIMPEDANCE AMPLIFIER WITH EXPANDED DYNAMIC RANGE

(75) Inventor: Jeremy Gareth Chatwin, Santa Cruz, CA (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/910,660

(22) Filed: Jul. 20, 2001

(65) Prior Publication Data

US 2002/0101285 A1 Aug. 1, 2002

Related U.S. Application Data

(60) Provisional application No. 60/250,611, filed on Dec. 1, 2000.

(51) Int. Cl.⁷ .................................................. H03G 3/10
(52) U.S. Cl. ..................... 330/279; 330/282; 330/133
(58) Field of Search ......................... 330/133, 134, 330/136, 254, 279, 282

(56) References Cited

U.S. PATENT DOCUMENTS

| | | | | |
|---|---|---|---|---|
| 3,679,986 A | * | 7/1972 | Zaman, III | 330/141 |
| 4,155,048 A | * | 5/1979 | Kabayama | 330/279 |
| 4,326,226 A | * | 4/1982 | Touchton et al. | 360/77 |
| 5,168,148 A | * | 12/1992 | Giebel | 330/134 |
| 5,451,901 A | * | 9/1995 | Welland | 330/133 |
| 5,483,200 A | * | 1/1996 | Okabayashi et al. | 330/282 |
| 5,923,164 A | * | 7/1999 | Ehling et al. | 330/279 |
| 5,955,925 A | * | 9/1999 | Segawa et al. | 330/279 |

* cited by examiner

Primary Examiner—Tuan T. Lam
(74) Attorney, Agent, or Firm—Reed Smith Crosby Heafey; John W. Carpenter

(57) ABSTRACT

Wide dynamic range and stability are achieved by adjusting a gain control resistance of an amplifier such that the pole ratio between the input and output is stable and by using a gain compensation technique to adjust output current. Adjustment of the gain is performed by determining a peak voltage between a gain stage and a dummy gain stage amplifier that does not amplify the input voltage. The peak voltage is compared to a gain control reference voltage and the comparison output is used to regulate both the variable gain and the gain compensation. The variable gain is performed using an FET variable resistor in a feed back loop of the amplifier. The gain compensation technique uses an FET variable resistor to adjust a voltage level of a driving transistor that adjusts an amount of current provided to an input of a current mirror. The mirrored current is then used to drain bias current from the amplifier.

29 Claims, 10 Drawing Sheets

STABLE AGC TRANSIMPEDANCE AMPLIFIER WITH EXPANDED DYNAMIC RANGE

CROSS REFERENCE TO RELATED APPLICATIONS AND CLAIM OF PRIORITY

This invention claims priority to the following co-pending U.S. provisional patent application, which is incorporated herein by reference, in its entirety:

Chatwin, Provisional Application Ser. No. 60/250,611, entitled "A Novel AGC Transimpedance Amplifier," attorney docket no. SONY-10900, filed Dec. 1, 2000.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

The present invention relates to electronic circuit amplifiers. The invention is more particularly related to increasing the dynamic range of amplifiers while maintaining stability. The invention is useful in many types of circuits, and particularly within an optical transducer.

2. Discussion of Background

Many types of electrical circuits receive input signals and either translate those signals to another format (e.g. optical to electrical, level translations, etc.). A typical optical storage or transmission channel may use some form of optical to electrical system to translate the data modulated light to a corresponding electrical signal such that it may be further processed in a receiver. One type of translation system uses a semiconductor transducer whose current flow is modulated by the light illuminating it and output to a receiver. However, the output current amplitude is too small to be usefully applied directly to the circuits that comprise the data recovery circuits in the receiver and so some form of amplification must be performed. The output current amplitude is dependant on many factors. One significant factor is the light amplitude incident on the transducer. The incident light may be of any arbitrary amplitude, depending upon factors such as transmitter light magnitude, distance between light transmitter and receiving transducer. However, a typical amplifier lacks the required dynamic range for amplifying all the output signals to be applied to the circuits.

U.S. Pat. No. 5,532,471, an embodiment of which is shown in FIG. 1A, illustrates one attempt to solve such amplification requirements. A common emitter gain stage 100 followed by a voltage buffer 110 to drive a shunt feedback network 120 to the input. The feedback network 120 comprises a fixed resistor in parallel with a variable resistor FET device. The effective resistance of the feedback network is controlled by the average amplitude of the output signal—the purpose being to increase the dynamic range.

This implementation achieves a wide dynamic range, but does so at the cost of complexity. To stabilize the amplifier 2 extra FETs are used to track the feedback resistor. One is used to reduce $R_c$ such that the ratio of $$\frac{p2}{p1} = \frac{R_F C_1}{a C_3 R_C}$$

can be guaranteed to be above a minimum of 2.75. The other FET is used to progressively degenerate the gain stage to further increase the pole frequency ratio by further reducing the open loop amplifier gain, "a". The extra circuit complexity is illustrated in FIG. 1B and manifests itself in the requirement for the extra inverting element 118. The increasing emitter degeneration caused by 106 forces the input voltage to increase at higher input amplitudes. This reduces the reverse bias voltage on the transducer as more voltage is dropped across the compound emitter resistance 104,106.

U.S. Pat. No. 5,737,111 uses the same CE gain stage followed by a voltage buffer stage driving a feedback resistor, similar to FIGS. 1A and 1B. However, to accommodate larger input signals, it has some form of limiting diode across the feedback resistor to clamp the signal amplitude. To overcome signal distortion introduced by the clamping mechanism, a DC restore mechanism is introduced by subtracting a DC current from the large amplitude current input signal when an arbitrary amplitude threshold has been crossed.

Meyer et al., IEEE Journal of Solid State Circuits, vol. 29, No. 6, June 1994, Page 701, "A Wideband Low-Noise Variable-Gain BiCMOS Transimpedance Amplifier" is a more complex implementation. As shown in FIG. 2, a voltage buffer stage 200 precedes a gain stage 210 and it has a facility to vary the overall gain to accommodate a wide dynamic range. However this is accomplished using 4 FETs as variable resistors to track the main feedback resistor 230.

Specifically, with respect to FIG. 3, in Meyer, the main feedback element is $R_C$. $R_D$ tracks $R_C$ to control the bandwidth and ensure stability by maintaining separation between the input and output poles. $R_A$ is a local shunt to further reduce the gm of the input darlington—and hence the loop gain. $R_B$ achieves a similar purpose as $R_A$ by reducing the stage gm and increasing the large signal handling capability at the input of the amplifier by degenerating the input gm stage.

The final variable resistor, $R_E$, is used to further attenuate the output signal by reducing the differential gain of the output stage.

In Khoman Phang et al., IEEE Transactions on Circuits and Systems II: Analog and Digital Signal Processing, Vol. 46, No. 7, July 1999 "A CMOS Optical Preamplifier for Wireless Infrared Communications," a variable gain approach is used. This approach includes two cascaded common source gain stages connected in a differential configuration.

IEEE Journal of Solid State Circuits, vol. 35, No. 9, Sep. 2000, Page 1260 "High-Gain Transimpedance Amplifier in InP-Based HBT Technology for the Receiver in 40-Gb/s Optical-Fiber TDM Links" Jens Müllrich et al. shows a similar approach to Phang. With a differential amplifier, with out variable gain control, but an average signal detector. This time the generated average voltage signal is applied as a bias voltage to the opposing amplifier input.

Each of the above solutions provides wider dynamic range for applications such as an optical transducer. However, the circuits have a degree of complexity that reduces the optimum tradeoff between bandwidth and noise as well as increasing cost.

SUMMARY OF THE INVENTION

The present inventor has realized the need for low cost wide dynamic range amplifiers that exhibit stability. The present invention provides an amplifier having wide dynamic range and stability by adjusting a gain control resistance of the amplifier such that the pole ratio between the input and output is stable and by using a gain compensation technique to reduce gain stage bias current and, hence the stage gain.

The present invention is embodied as an automatic gain control (AGC) circuit, comprising, a gain stage having, a gain stage amplifier coupled to an input of the AGC circuit, and a gain control mechanism coupled to the gain stage amplifier and configured to vary the gain of the gain stage amplifier; and a gain control circuit coupled to an output of the gain stage amplifier and configured to output a voltage that adjusts the gain of the variable gain control mechanism based on the output of the gain stage amplifier.

The invention may be embodied as an automatic gain control (AGC) circuit, comprising means for varying an amount of gain of the gain stage amplifier based on an output voltage level of the gain stage amplifier; and means for reducing a bias current of the gain stage amplifier based on an output voltage level of the gain stage amplifier.

The invention also includes a method of controlling a gain of a gain stage amplifier over a wide dynamic range of inputs applied to the gain stage amplifier, comprising the steps of varying an amount of gain of the gain stage amplifier based on an output voltage level of the gain stage amplifier, and reducing a bias current of the gain stage amplifier based on an output voltage level of the gain stage amplifier.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Observations and analysis of amplification circuits is now discussed in reference to a foundation upon which the present invention is based. As noted above, the present invention is particularly well suited to amplification roles in optical transducer devices. The optical transducer receives light signals converting them to currents and applying them to an input circuit. Since the currents applied to the input circuit are too small to be usefully applied to data recovery circuits, these input currents need to be amplified.

However, since the light signals may have significant variations in intensity, resulting in a wide range of input currents, the amplification circuits need to be capable of handling a wide dynamic range of input currents depending on the strength of the received light signal. The received signal strength will vary, for example, as a function of distance from the transmitter, quality of circuit components, etc. In most cases, the receiving system has no prior knowledge of its distance from the transmitter and it is therefore important that any designs have the flexibility to accommodate the full range of input signal strengths.

Various solutions have been proposed: from clamping the voltage output with a schottky diode, to implementing a gain control circuit. However, as discussed above, the previously proposed solutions are complex, or other inefficiencies result in a less than ideal solution.

Another important feature of the input circuit is a low input impedance. The semiconductor transducer is typically a reverse biased diode, which will have a large DC resistance. The connection between semiconductor transducer and amplifier input will be band limited.

Figure 1A:
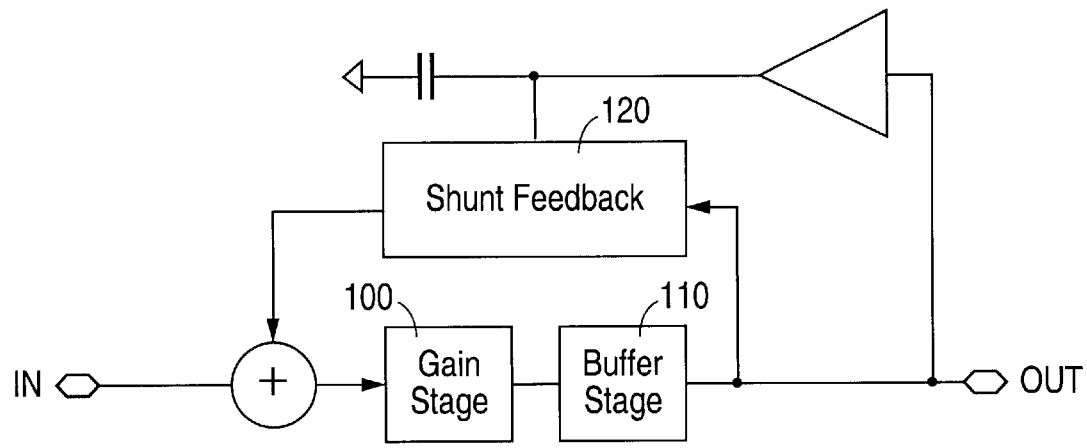
FIG. 1A is block circuit diagram of a typical amplifier circuit using a typical shunt feedback network to increase dynamic gain.
Figure 1B:
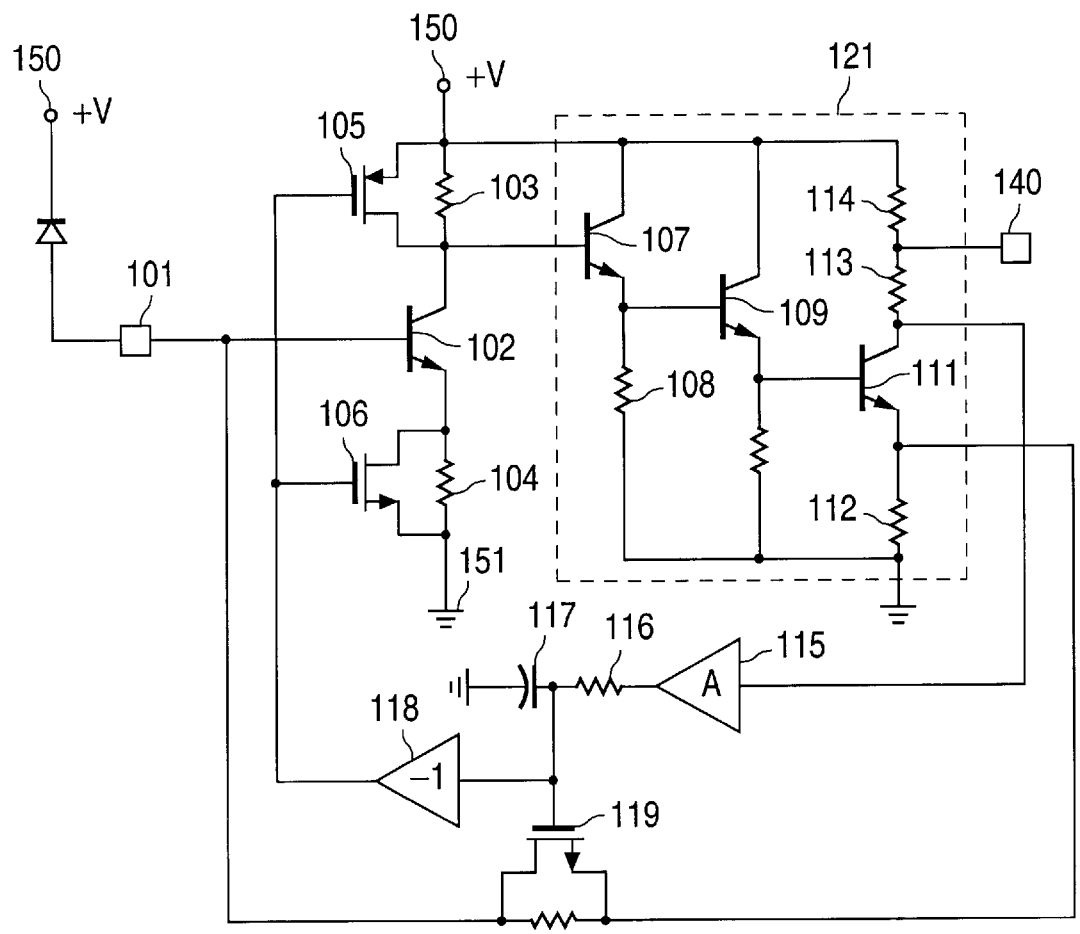
FIG. 1B is a circuit diagram of a known FET arrangement for stabilizing an amplifier.
Figure 2:
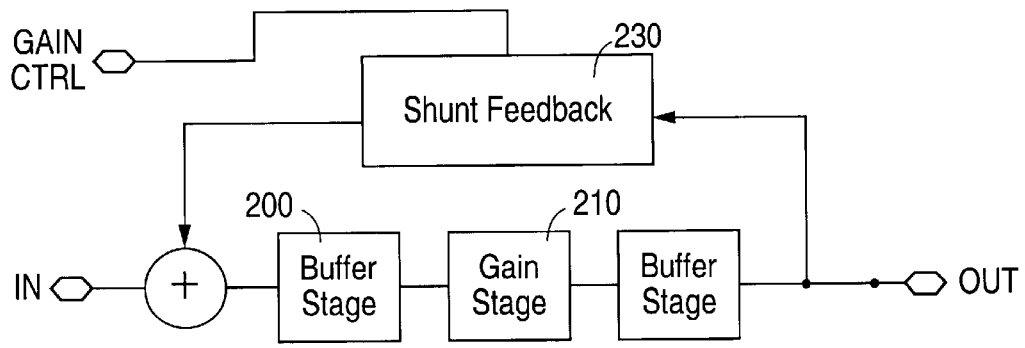
FIG. 2 is block diagram of another known amplifier circuit that varies the overall gain of the circuit to achieve a wider dynamic range.
Figure 3:
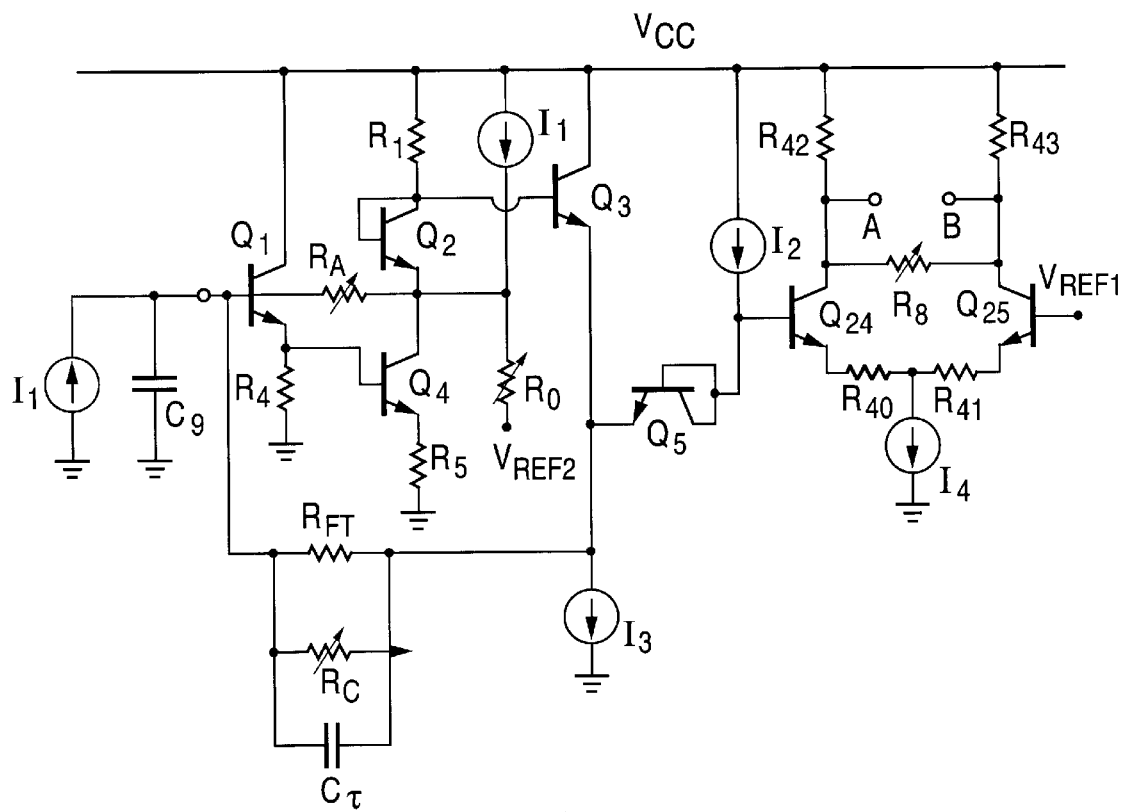
FIG. 3 is a circuit of a specific implementation for increasing dynamic range of an amplifier.
Figure 4:
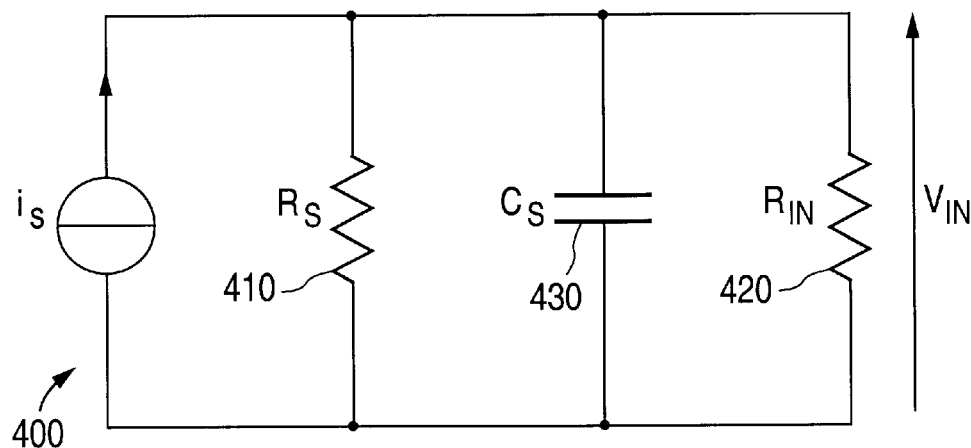
FIG. 4 is a circuit model of principal impedances of a semiconductor transducer input circuit.

Referring again to the drawings, wherein like reference numerals designate identical or corresponding parts, and more particularly to FIG. 4 thereof, there is illustrated is a circuit model of principal impedances of a semiconductor transducer input circuit 400. The input circuit 400 has a band limited input that is determined by a parallel combination of a source resistance of the semiconductor transducer, $R_S$ 410, an amplifier input impedance, $R_{IN}$ 420, and any capacitances associated with the transducer, interconnect and amplifier, $C_s$ 430.

For the input circuit 400, a high frequency roll off frequency, $f_{IN}$, for the connection from transducer to the amplifier input will be determined by the equation $$f_{IN} = \frac{1}{2\pi(R_S // R_{IN})C_S}.$$

Thus for typical values of $C_s=1pF$, $R_S=200$ Kohm, and the parallel combination of $R_S$ and $R_{IN}$ in the region of 100 Kohm, then the −3 dB frequency will be in the region of 1.6

MHz. For an amplifier with a target bandwidth of 2 GHz the input impedance, $R_{IN}$, must be reduced such that the parallel combination of $R_{IN}$ and $R_S$ is in the order of 80 ohm. However the penalty for this bandwidth improvement is dramatically reduced voltage amplitude at the amplifier input.

Figure 5:
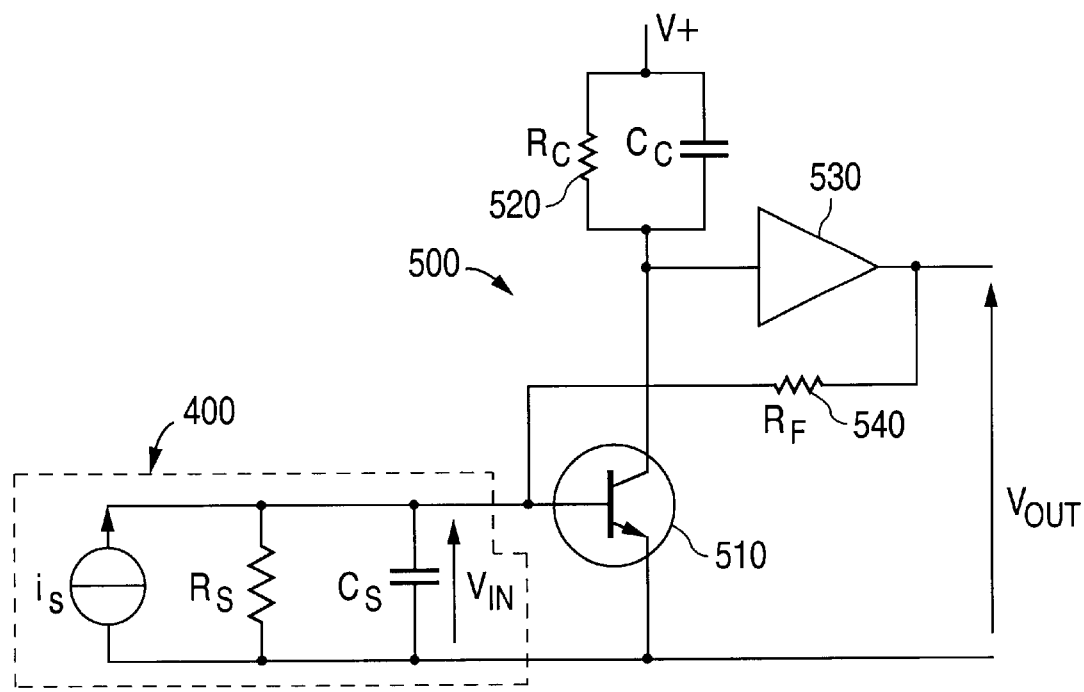
FIG. 5 is circuit diagram of a preamplifier having a gain stage (transistor and $R_C$), and a unity gain voltage buffer driving an output of a feedback resistor $R_f$.

Yet another important feature of the amplification circuit is that it be stable under all conditions. When used as a variable gain stage, the amplifier must be stable across all input amplitudes and gains. A practical implementations of an amplifier circuit 500 is shown in FIG. 5, in the form of a preamplifier having a gain stage (transistor 510 and $R_C$ 520), and a unity gain voltage buffer 530 driving an output of a feedback resistor $R_f$ 540. In FIG. 5, the feedback network is used to set the amplifiers closed loop gain. However it also reduces the input impedance, $R_{IN}$, of the amplifier by a factor of the loop gain. In the circuit 500, there exists two frequency poles—one at the input ($f_{IN}$), and one at the output —$f_{OUT}$. The circuit input resistance, $R_{IN}$ (same as the $R_{IN}$ of FIG.5), is dominated by $R_F$ divided by the loop gain such that:

$$R_{IN} = \frac{R_F}{A_V}$$

where $A_V$ is the loop gain. Thus the input pole, at frequency $f_{IN}$, is given by:

$$f_{IN} = \frac{1}{2\pi R_{IN} C_S} = \frac{A_V}{2\pi R_F C_S}$$

The output pole, $f_{OUT}$, is determined by the gain stage collector load, $R_C$, and its associated parasitics, $C_C$:

$$f_{OUT} = \frac{1}{2\pi R_C C_C}.$$

To guarantee stable operation over wide variations of $R_F$ the ratio $f_{OUT}$:$f_{IN}$ of this pole ratio must be greater than 2.75 over all operating conditions.

Substituting for the pole ratio and by defining $A_V = G_M R_C$ as the gain stage voltage gain (where $g_M$ is the open loop gain stage transconductance of device 510) we get:

$$\frac{f_{OUT}}{f_{IN}} = \frac{g_m R_F}{A_V^2} \frac{C_S}{C_C},$$

showing that if the feedback, $R_F$, is reduced to accommodate larger input signals then the ratio $f_{OUT}$:$f_{IN}$ will reduce and instability will become more likely. Specifically a change of 5:1 in $R_F$ will correspond to a 5:1 change in pole ratio. Therefore, an amplifier with a 2 GHz minimum bandwidth set by $f_{IN}$=2 GHz and a dynamic range of 5:1 requires $f_{ouT}$ to be 2.75×5 times larger than $f_{IN}$ or 27.5 GHz just to maintain stability over the full dynamic range. This requires an expensive process and/or large power dissipation and/or complex circuitry and/or a severe tradeoff on other key parametrics—particularly noise.

Yet another preferred feature of an amplification circuit is one that introduces the least amount of noise to the signal. The low input impedance requirement causes the voltage amplitude at the amplifier input to be substantially attenuated. Thus, for a typical input current amplitude, $i_S$, of 20 uA peak-to-peak and a $R_{IN}$ of 100 ohm, the input voltage will be in the range of 2 mV peak-to-peak. For a particular bit error rate, a certain minimum SNR is required. This will then determine the maximum sensitivity of the amplifier. The lower the noise added by the amplifier, the lower the minimum signal amplitude can be whilst maintaining a given minimum SNR, hence the larger the sensitivity, and an example of the trade off between bandwidth and sensitivity.

Preferably, a minimum DC bias voltage across the semiconductor transducer needs to be at least 2 V. The semiconductor photodiode typically used with this amplifier requires some reverse bias voltage for optimum performance. This allows a depletion region to form on either side of the PN junction. This has the effect of reducing the parasitic capacitance, $C_S$, and so enhancing the high frequency operation of the photodiode. In addition the larger reverse voltage increases the linearity of the photodiode light to current conversion. Usually the photodiode speed decreases with decreasing reverse bias therefore a minimum reverse bias must be maintained.

Figure 6:
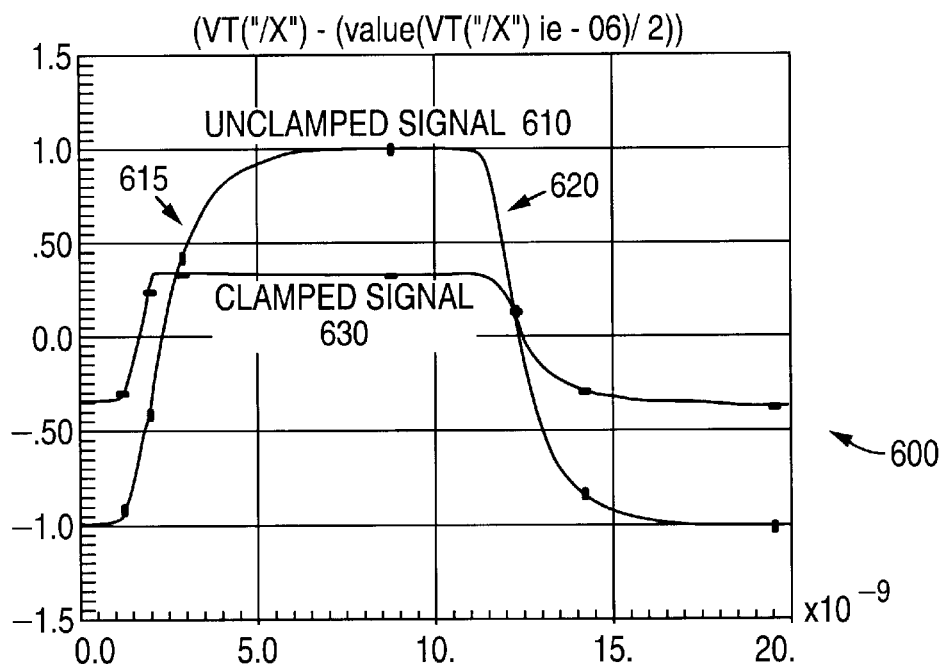
FIG. 6 is a graph illustrating distortion caused by clamping.

The dynamic range of the amplification circuit may be improved by limiting the output voltage. However, relying on a clamp circuit to limit the amplifier output voltage causes amplitude distortion. Referring to FIG. 6, there is shown a graph 600 illustrating distortion caused by clamping. A unipolar current is dropped across a parallel $R_C$ to produce a 2 Vpp signal. The resulting waveform, with a DC restore circuit implemented, is shown labeled "UNCLAMPED SIGNAL" 610. Note that the waveform has symmetrical rising and falling edges 615 and 620. Also the negative and positive amplitudes are equal and opposite.

By applying a generic diode across the $R_C$ network a clamp has been implemented. This can be seen by the reduced amplitude of the trace labeled "CLAMPED SIGNAL" 630. Unfortunately this causes the rising and falling edges to be asymmetrical. Indeed, the zero crossing points are now different from the UNCLAMPED SIGNAL 610 and the pulse has been effectively broadened.

This pulse width or duty cycle distortion is undesirable and will cause problems in the receiver signal path. Therefore, unless clamping can be performed symmetrically it will remain a less desirable form of gain control, even if the clamping incorporates a DC restore loop. The DC restore loop strives to add an offset to the input of the amplifier such that, averaged over some long period of time (in the order of thousands of data bits), the average output is zero, or some other reference level. The goal being to bias the amplifier such that it's input is centered on the middle part of the incoming signal, the "zero" crossing.

AGC Control Loop Implementation

Although other gain control mechanisms may be implemented, in the present invention the gain of an AGC amplifier is preferably controlled by a compound feedback resistor. This compound resistor comprises a Field Effect Transistor (FET) connected in parallel with a fixed resistor. The effective resistance is controlled by the voltage on the FET gate terminal. An AGC control loop will strive to control the amplitude at the amplifier output to be at some constant reference level. In other words, the AGC loop, when operating, will modulate the gain to maintain a constant peak $V_{ds}$ across the FET portion of the compound feedback resistor.

Figure 7:
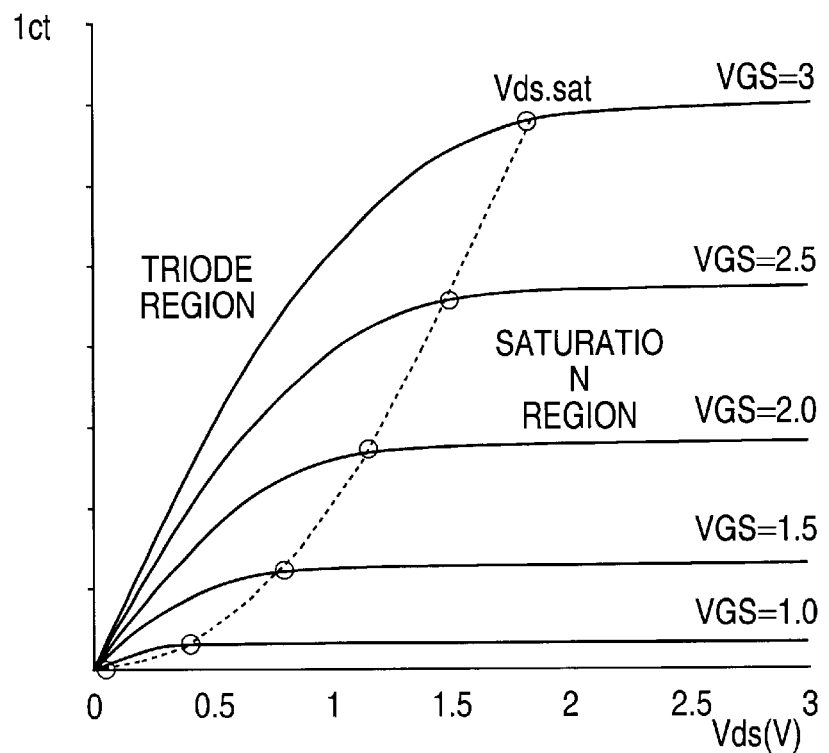
FIG. 7 is a graph illustrating FET characteristics showing a division between the triode and saturation regions.

FIG. 7 shows a $I_d/V_{ds}$ characteristic for various gate voltages. To maintain low distortion the FET must be in the triode mode for all portions of the input signal. If the input signal causes a $V_{ds}$ to be larger that $V_{ds,sat}$ for any portion of its waveform then distortion will dramatically increase to unacceptable levels. Thus, using the curve below, if the AGC is set to limit the gain to 1.0 Vpp then, for VGS=1.0 V or 1.5

V, the FET will be operating in the triode mode for part of the signal and the saturation mode for the other. This distortion results because of the very different channel resistance characteristics in the two operating modes. These low values of VGS will occur when the AGC loop has just started to exert control over the gain. Therefore it becomes necessary to either guarantee that the control loop never starts with low values of VGS or to limit the AGC reference amplitude to very small $V_{ds}$ in the tens to low hundreds of millivolts.

For an AGC loop that utilizes an average amplitude technique to control the gain, the AGC reference voltage will be below the $V_{ds,sat}$ line but it will still be possible that part of the signal amplitude will cross over the $V_{ds}=V_{ds,sat}$ line and enter the saturation region. However, using a peak amplitude technique, where the peak $V_{ds}$ amplitude is used to control the AGC, this effect can be minimized.

In the prior art discussed above, previous methods overcome this non-linearity by making a compound resistor of two differently sized FETs, in parallel, and switching on the smaller one first followed by the larger one as the input amplitude increases. However, this is a complex arrangement of parts.

Low Noise, Wide bandwidth and Design Complexity

Low noise with wide bandwidth is a mutually exclusive requirement. One must be traded with the other to reach an optimum compromise for the particular application. This optimum compromise is dependant on circuit complexity, fabrication process and several other factors. In general, the more components in the signal path, the more noise sources are present. In addition, if these extra components are part of a feedback loop, greater difficulty may be experienced in stabilizing the circuit over all operating conditions. Put briefly, less complexity is better—both for noise and for stability. For example, referring back to *Meyer* et al., two buffer stages and a gain stage in a feedback loop are utilized, increasing the number of parasitic nodes and complicating the circuit design. Similarly, 5 FETs perform various control functions to limit the gain and stabilize the loop.

However, the present invention achieves these conditions through a reduction in circuit complexity and fewer stages. The present invention strives to achieve a preferred option, that is to ideally have one gain stage and as few signal nodes as possible, and design a topology that is simple to stabilize by maintaining a close to constant $f_{OUT}:f_{IN}$ pole ratio over all gains.

Transducer Bias Voltage

This particular device operates with a low 3 V supply and so, to maintain a minimum 2 V bias across the transducer, the input terminal voltage must not exceed 1 V. This allows the transducer to be connected from the input terminal to the positive terminal. If the 2 V reverse bias between input and positive supply cannot be maintained, the amplifier user would need to go to the additional expense of providing a higher supply voltage just to bias the transducer—a non optimal solution. To maintain this 1 V input terminal voltage a minimum of degeneration should be used in the emitter circuit of the input transconductor.

Overall Topology

Figure 8:
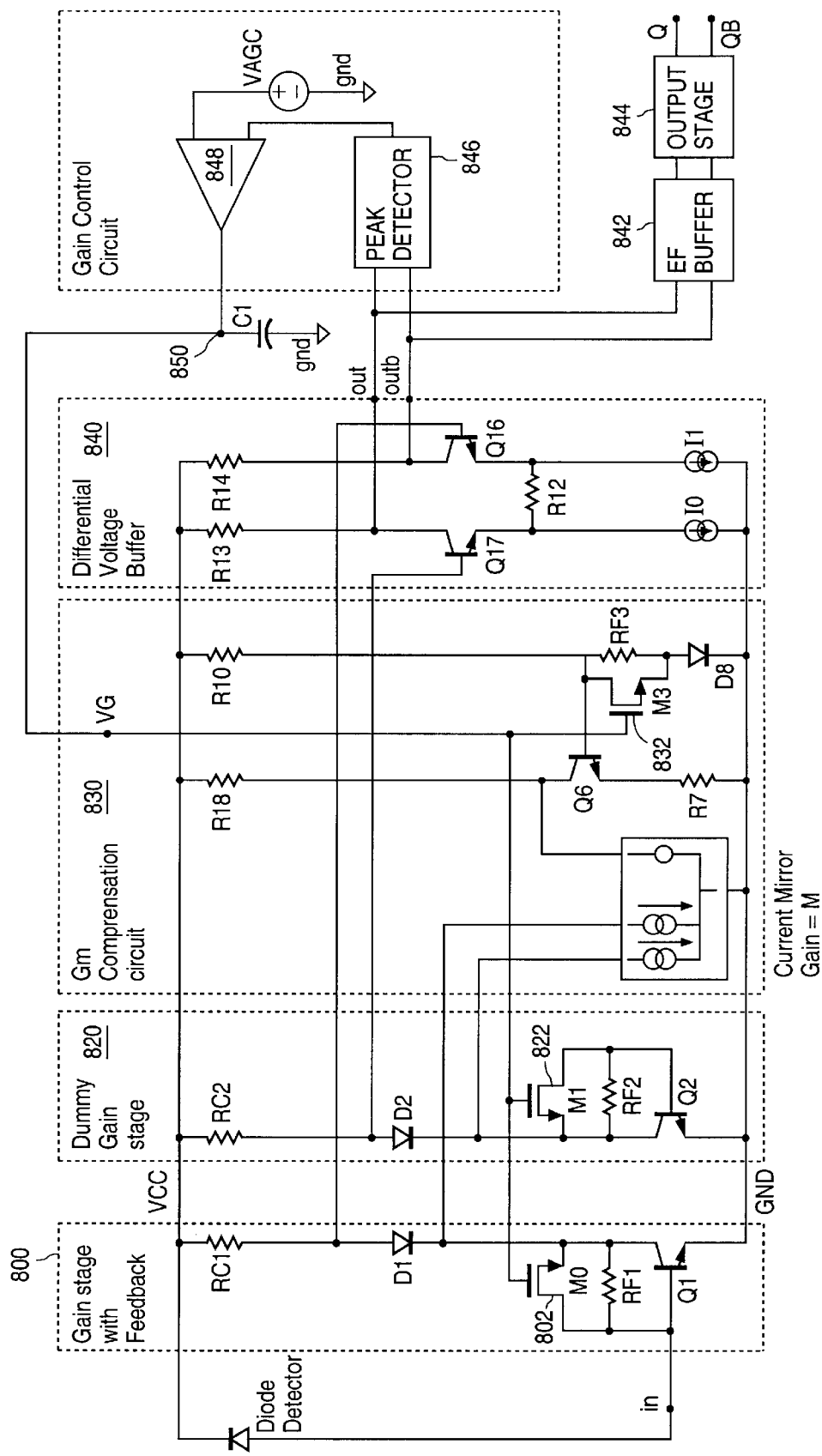
FIG. 8 is a circuit diagram of an implementation of an embodiment of the present invention.

An embodiment of the present invention is shown in FIG. 8 and consists of a gain stage 800, which, for example, is comprised of an input transistor Q1, feedback resistance RF1 and collector load resistor RC1, to which the input signal is applied at terminal 'in'. There is a dummy gain stage 820 comprised of Q2, RF2 and RC2, each of which track Q1, RF1 and RC1 over supply, temperature, and process variations. The output signals of the gain stages 800 and 820 are then coupled via a differential voltage buffer 840. The diodes D1 and D2 serve as level shifters. At the output of the differential voltage buffer 840 the signal is converted into a symmetrical differential signal (out, outb). This signal is further buffered with an emitter follower buffer 842 before being applied to a differential output stage 844.

The differential voltage buffer output signal is also applied to a peak detector 846 to measure the peak amplitude of the signal. The measured peak amplitude value of the signal is then compared to a reference voltage, VAGC, and amplified by amplifier 848 to produce a gate voltage 850. The combination of Peak Detector 846 and amplifier 848 comprise a gain control circuit. The gate voltage 850 is applied to variable resistors 802, 822, and 832. In this embodiment, variable resistor 802 is a compound resistor comprising a combination of feedback resistor RF1 and an FET M0. Variable resistor 822 is the combination of RF2 and FET M1, and variable resistor 832 is the combination of RF3 and FET M3. Applying the gate voltage 850 to the gates of corresponding FETs (M0, M1, and M3) in the variable resistors 802, 822, and 832 implements an automatic gain control loop, set by the voltage VAGC. The feedback being adjusted by M0 and M1 respectively in each of the gain stage 800 and dummy gain stage 820, and gain compensation being adjusted in gain compensation circuit 830 by M3.

The variable resistor elements may be either N type or P type FETs. The input transistor, Q1, may be substituted with a NFET device. In addition the circuit may be reversed and a P type device used in place of Q1. Based on the present disclosure, an ordinarily skilled practitioner of the art may substitute other various parts to produce similar results and not depart form the spirit and scope of the present invention.

First stage stability

We now discuss the details and calculate the first stage AC characteristics and the stability. The transconductance of input transistor Q1 ($g_m$) provides forward signal gain. Signal current will flow through the feedback resistor parallel combination of M0 and RF1 and into the collector of Q1. Therefore when the signal current amplitude is comparable to the biasing collector current, IB, the gm of Q1 will be modulated. Thus gm is expressed:

$$g_m = \frac{I_B + \bar{I}_{in}}{V_T},$$

where $\bar{I}_m$ is the average input current and $V_T$ is the thermal voltage kT/q.

The AGC loop strives to maintain a constant peak amplitude at the output of the circuit. It is assumed that the peak amplitude is twice the average input current. Therefore the effective feedback resistance caused by the parallel combination of RF1 and M0 is given:

$$R_{F,eff} = \frac{V_{AGC}}{2\bar{I}_{in}},$$

where VAGC is the AGC reference voltage.

The impedance in the collector load circuit is expressed:

$$R_{C,eff} = \frac{R_C R_{F,eff}}{R_C + R_{F,eff}}$$

where RC is the resistor RC1.

The voltage gain can then be expressed as $A_V = G_m R_{C,eff}$. Therefore the input resistance is simply the effective feedback resistance divided by the loop gain:

$$R_{in} = \frac{R_{F,eff}}{A_V} = \frac{R_{F,eff}}{g_m R_{C,eff}}$$

Consequently the frequency ratio of input pole to output pole that is used as a coarse, first order measure of stability is expressed:

$$\frac{f_{out}}{f_{in}} = \frac{C_S R_{in}}{C_C R_{C,eff}} = \frac{C_S}{C_C} \frac{R_{F,eff}}{g_m R_{C,eff}^2} = \frac{C_S}{C_C} \frac{1}{g_m R_C} \left( \frac{R_C}{R_{F,eff}} + 2 + \frac{R_{F,eff}}{R_C} \right)$$

The term in brackets, $$\left( \frac{R_C}{R_{F,eff}} + 2 + \frac{R_{F,eff}}{R_C} \right),$$

never goes below 4 and, if gm does not vary with signal amplitude, the value of RC and gm can be tuned to accommodate the desired pole ratio minimum of 2.75 with any given $C_S:C_c$ capacitance ratio over any value of $R_{F,eff}$. However gm does increase with increasing input signal amplitude and this serves to reduce the pole ratio.

Therefore, additional control is provided to maintain a high enough pole ratio and to compensate for the gm variation when $I_{in}$ is comparable to the Q1 bias current. Specifically the Gm Compensation Circuit 830 in FIG. 8 is used to reduce the bias current into Q1 and hence reduce gm at high input signal amplitudes.

Resistor R10 acts as a current source, of value IX, that sets a voltage drop across the compound resistor RF3, M3. This compound resistor approximately tracks the other compound feedback resistors as it is of the same type and size and its terminal voltages are similar. Q6 is connected such that the voltage across RF3, M3 is forced across R7 determining that the
collector current through Q6 shall be approximately $$I_X \frac{R_{F,eff}}{R_7}.$$

The resistor R18 also acts as a simple current source providing a current, IX, of similar magnitude to the current provided by R10. This is the case when the collector voltage of Q6 is similar to the base of Q6. Thus the net current forced into the input of the current mirror is $$I_X \left( 1 - \frac{R_{F,eff}}{R_7} \right) \bigg|_{R_{F,eff} < R_7}.$$

$$0 |_{R_{F,eff} >= R_7} |$$

This current is multiplied M times by the current mirror where it is injected into the gain stage and dummy stage at the collectors of Q1 and Q2. The injected current reduces these devices' collector bias current and hence reduces their gm as a function of $R_{F,eff}$.

The amount of multiplication, M, must be such that, under the condition of minimum $R_{F,eff}$, Q1 and Q2 will still have enough bias current to adequately pass signal over the required bandwidth. At the opposite extreme, when $R_{F,eff}$ is at it's maximum value, the Gm compensation circuit should be turned off. This occurs when, for example $R_{F,eff} > R_7$. The input side of the current mirror with gain=M can only sink current and so will be cut off.

The pole ratio is then determined by the expression:

$$\frac{f_{out}}{f_{in}} = \frac{C_S}{C_C} \frac{v_T}{R_C} \frac{1}{I_B + \bar{I}_{in} - MI_X \left( 1 - \frac{R_{F,eff}}{R_7} \right)} \left( \frac{R_C}{R_{F,eff}} + 2 + \frac{R_{F,eff}}{R_C} \right)$$

Note that the pole ratio is composed of a number of factors, including:
the capacitor ratio $C_S:C_C$ which is fixed over all $R_{F,eff}$;
the ratio of $V_T:R_C$ which is also fixed over all $R_{F,eff}$;
the factor with 1B in the denominator which, for moderate values of Iin is approximately inversely proportional to $R_{F,eff}$. This factor is denoted "1/1B . . . "; and the factor with RC/$R_{F,eff}$ which is limited to a value of 4 and is denoted "RC/RF+ . . . ".

Figure 9:
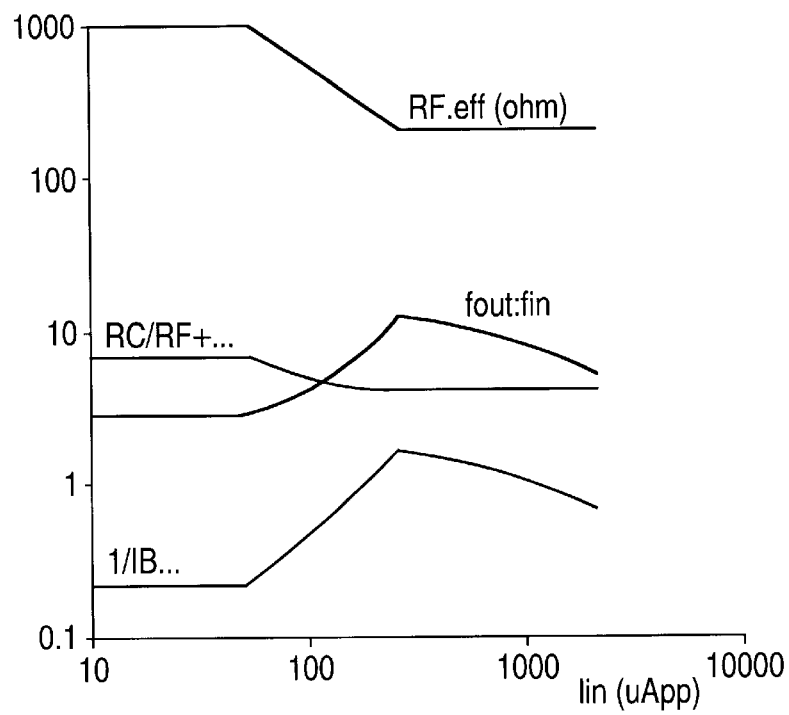
FIG. 9 is a graph of a pole ratio and factors that contribute to the pole ratio.

These factors, and their relationship to $R_{F,eff}$ and hence Iin are illustrated in FIG. 9 with typical values used in an example implementation.

Example Implementation

This design was fabricated in a BiCMOS process with NPN ft=25 GHz. Tradeoffs in circuit parameter resulted in the following choices for component values:

| $C_S$ | 0.8 pF | $R_{F,eff}$(max) | 1KΩ | $R_C$ | 219Ω | $I_B$ | 4.6 mA | $V_{AGC}$ | 50 mV |
|---|---|---|---|---|---|---|---|---|---|
| $C_C$ | 50 fF | $R_{F,eff}$(min) | 200Ω | $R_7$ | 1KΩ | $I_X$ | 80 uA | M | 64 |

The corresponding pole ratio is plotted in FIG. 9 and shows that for values of input current from 10 uA up to 2 mA peak to peak the ratio does not fall below 2.75. Many other component values may be substituted and produce similar results, as will be apparent to the practitioner based on this disclosure.

Thus, the present invention provides wide dynamic range and stability in an uncomplicated arrangement of components. The first stage of the amplifier, which provides most of the low noise signal gain, is implemented in a simplified circuit with a minimum of components, without additional buffers or gain stages in the loop.

Loop stability over different gain settings is accomplished using two techniques: varying the gm of the input transistor using a compensation circuit; and by virtue of the connection of the feedback resistor directly to the output of the input transconductor, Q1, such that the feedback resistor automatically reduces the loop gain. Gain variation and loop stability are both controlled by 3 instances of the same variable resistor operating under similar terminal voltages and operating conditions. This eases the tracking and means that the gain control circuitry can be simplified.

Referring again to FIG. 8, a circuit diagram of the preferred embodiment of the present invention. The circuit includes a gain stage, dummy stage, and differential voltage buffer. The differential voltage buffer may be constructed in many ways. Preferably, the differential voltage buffer is structured as a differential pair with an emitter degeneration resistor and active current sources (I0 and I1) to bias each side. The current sources require about 500 mV of headroom in which to operate. However, if the bases of Q17, Q16 were directly connected to outputs of the first and dummy gains stages, for example to the collectors of Q1 and Q2, the emitters of Q17, Q16 would be close to GND potential, maybe in the tens of millivolts range—rendering the current sources inoperable. Consequently the level shift diodes D1 and D2 are required to raise the common mode input voltage of the differential voltage buffer by approximately 700 mV such that the current sources have enough operating headroom. Whilst this produces acceptable performance it has the drawback of slightly extra complexity (the diodes), more signal nodes.

Figure 10A:
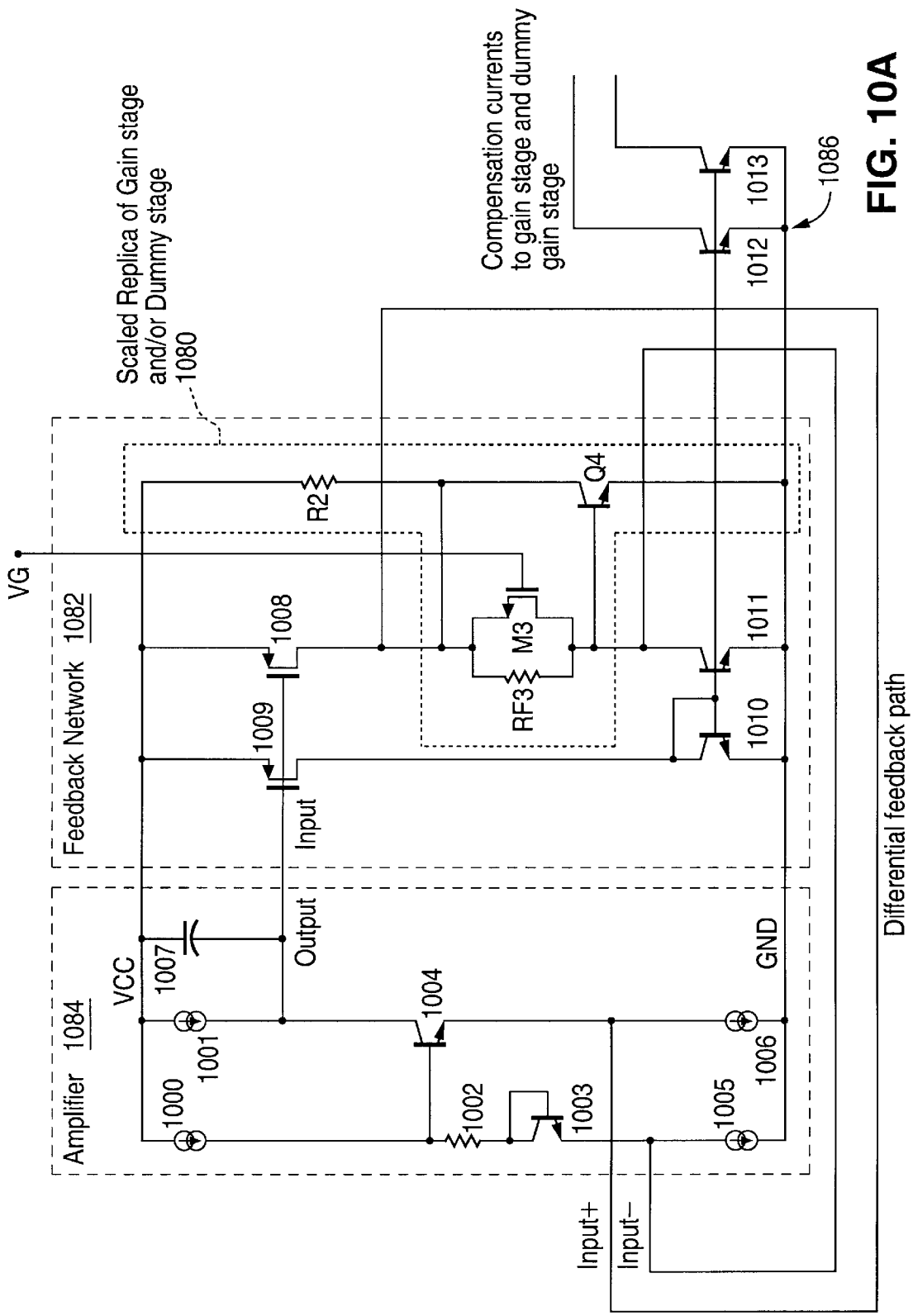
FIG. 10A is a block diagram having example circuit components of an alternative gain compensation embodiment of the present invention.

FIG. 10A is a block diagram having example circuit components of an alternative gain compensation embodiment of the present invention. The alternative gain compensation embodiment includes a scaled replica 1080 of the gain stage, a feedback network 1082, amplifier 1084, and a set of compensation current providers 1086. The amplifier 1084 is arranged as a current conveyor, having inputs Input+, Input–, and an Output.

The amplifier, 1084, has common base inputs (1003, 1004). The amplifier "output" pin voltage will increase when the voltage difference between "Input+" and "Input–" increases. The amplifier has high gain due to the use of a current source for the active load of 1004.

The feedback network comprises a replica of the gain/dummy stage (Q4, R2) complete with the feedback resistor (M3,RF3). Device 1008 converts the output voltage from the amplifier 1000–1007 to a current which flows through RF3//M3 and out through 1011 causing a voltage drop across RF3//M3. This voltage drop is then feedback to the input of the amplifier 1000–1007.

The amplifier 1000–1007 and feedback network are so configured that they will reach a stable operating point when the constant voltage drop across 1002 is impressed on the combination of RF3//M3 variable resistor. Thus the current forced through RF3//M3 by 1008 will be equal to the voltage across 1002 divided by the effective resistance of RF3//M3 which, in turn, is controlled by the gain control circuit. Therefore the current through 1008 and 1009 equals some multiple of the peak input signal current. The current through 1009 is then applied to the gain and dummy stages to reduce the gm of these stages and thus help to control and stabilize the overall amplifier. Table 1 provides a set of typical component values for the gain compensation embodiment of FIG. 10A.

TABLE 1

| | |
|---|---|
| 1000, 1001, 1005, 1006 | 2 uA constant current source |
| 1002 | 150K ohm resistor |
| 1003, 1004 | Generic NPN transistor, same size |
| 1007 | 2 pF capacitor |
| 1008, 1009 | W/L = 72u/1.2u PFET transistor |
| 1010, 1011 | Generic NPN transistor capable of conducting 2 mA |
| 1012, 1013 | Generic NPN transistor, double the area of 1010, 1011 |
| RC1, RC2, R2 | 220 ohm |
| Q1, Q2, Q4 | Generic NPN low noise transistor capable of conducting 5 mA |
| RF1, RF2, RF3 | 1K ohm |
| M0, M1, M3 | W/L = 64u/1.1u NFET transistor |

Figure 10B:
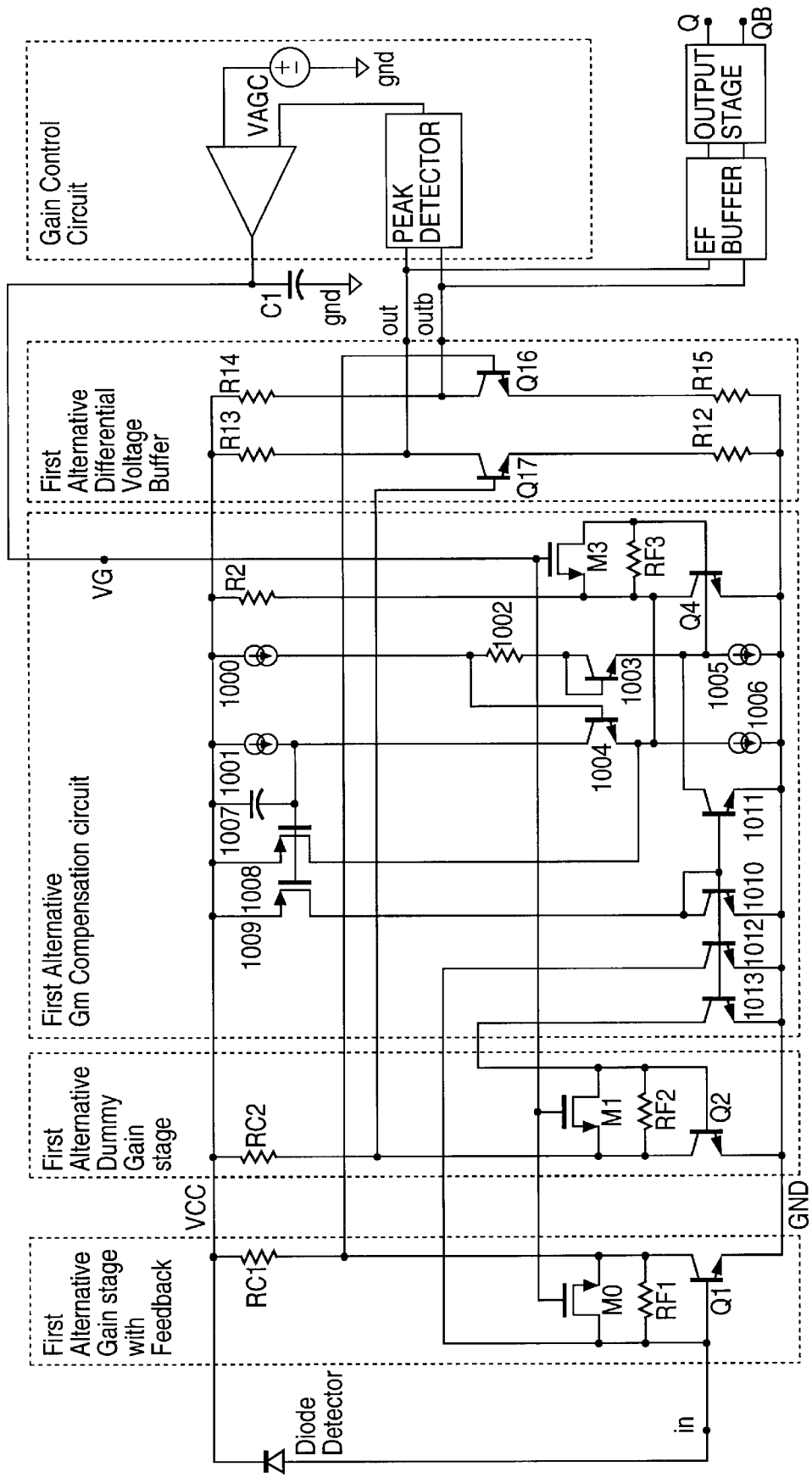
FIG. 10B is a circuit diagram of an implementation of the alternative gain compensation embodiment of the present invention.

FIG. 10B is a circuit diagram of an implementation of the first alternative embodiment of the present invention. The SC current sources have been removed from the differential voltage buffer, eliminating the need for the level shift diodes. The first alternative implementation of the differential voltage buffer splits the previous emitter degeneration resistor into two parts and shorts the center tap to GND. Thus the new implementation's emitter degeneration resistors—R12, R15—act as degeneration resistors and current sources. Care must be taken to ensure that the signal excursions on the collector of Q1 don't go so low that Q17 is taken out of conduction. This condition can be guarded against by modifying the gm compensation scheme.

FIG. 10B also includes a circuit diagram of an embodiment of the alternative gain compensation scheme of the present invention. The compensation current steals bias current from Q1 and Q2 by sinking through the feedback resistors, instead of stealing current at the collectors. This scheme guards against the input transistors of the differential voltage buffer from being turned off during large signal excursions on the collector of Q1. For example, this condition may only be a problem when the level shift diodes are not present.

Reiterating, the purpose of the alternative gain compensation scheme is to accurately measure the average input current amplitude and subtract a multiple from the input signal subject to some maximum. The amplifier formed by 1004, 1003, 1002, 1008 is part of a feedback loop. M3, RF3 and Q4 form the feedback element that complete the loop. M3, RF3, Q4 and R2 is an exact, scaled, replica of the gain stage and dummy gain stage. This means that the parallel combination of M3 and RF3 should have exactly the same characteristics as the signal gain stage.

Thus the feedback loop 1003, 1004, 1002, 1008, RF3, M3 strives to impress the voltage drop across 1002 on the parallel combination of M3 and RF3. The current sources 1000, 1001, 1005 and 1006 are all of a small magnitude (around 2 uA) compared to the Q4 bias current. The resistor 1002 is chosen such that it's voltage drop will be equivalent to some multiple, m1, of the AGC voltage. This voltage drop is then forced, by the loop, across the scaled replica M3, RF3. This then implies that the current through 1008 is then proportional to the peak input signal current. This is because the AGC loop, when active, strives to maintain a constant peak voltage across RF1, M0 by modulating the M0, M1, M3 gate voltage.

This proportional, recreated peak signal current in 1008 is duplicated by 1009 and passed to a current mirror 1010, 1011, 1012 and 1013. Source 1012 and 1013 sink this mirrored current out of the gain stage and dummy gain stage bases to reduce the gm of Q1 and Q2.

Figure 11:
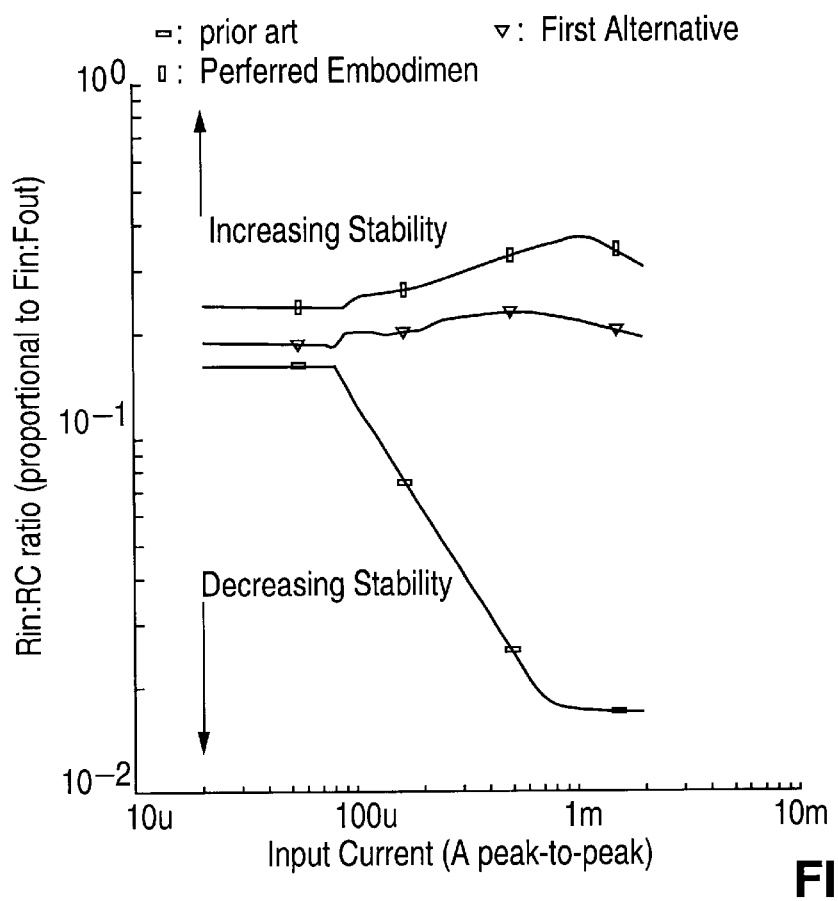
FIG. 11 is a graph comparing the fin:fout pole ratios for the prior art shown in FIG. 5; the pole ratio for the preferred embodiment; and the pole ratio for the first alternative.

This has the advantage of increasing the voltages on Q1, Q2 collectors in the presence of increased input signal amplitude and helps to guard against the input devices of the alternative implementation of the differential voltage buffer from going out of conduction and so preventing the onset of gross signal distortion. FIG. 11 serves to demonstrate the effects of these different circuit configurations on the pole ratio and, by implication the stability under large input signal. Specifically, the graph Y axis is the ratio of the closed loop input impedance (Rin) to the effective collector resistance (RC,eff). This factor is proportional to the fout:fin pole ratio. The X axis represents the input signal current.

Figure 12:
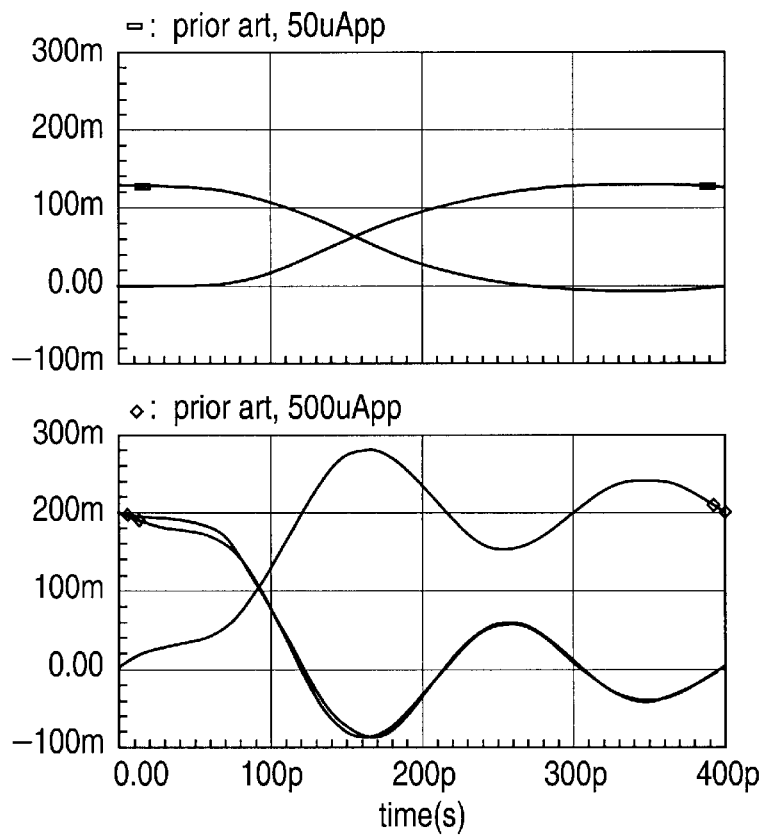
FIG. 12 is a graph showing the transient waveforms at two extremes of input amplitude for the prior art shown in FIG. 5.

The lowest trace shows a typical characteristic from the prior art—specifically that shown in FIG. 5. It is clearly seen that, when the AGC is active (90 uApp<Input Current<800 uApp), the pole ratio changes in proportion and stability degrades as the input current amplitude increase. This effect is further demonstrated by referring to the transient eye-diagrams in FIG. 12. At low input current (~50 uApp) the differential output voltage looks stable—there is no overshoot or ringing. However, with 500 uApp input current the differential output voltage looks dramatically different with substantial overshoot and ringing. Thus stability is compromised.

Figure 13:
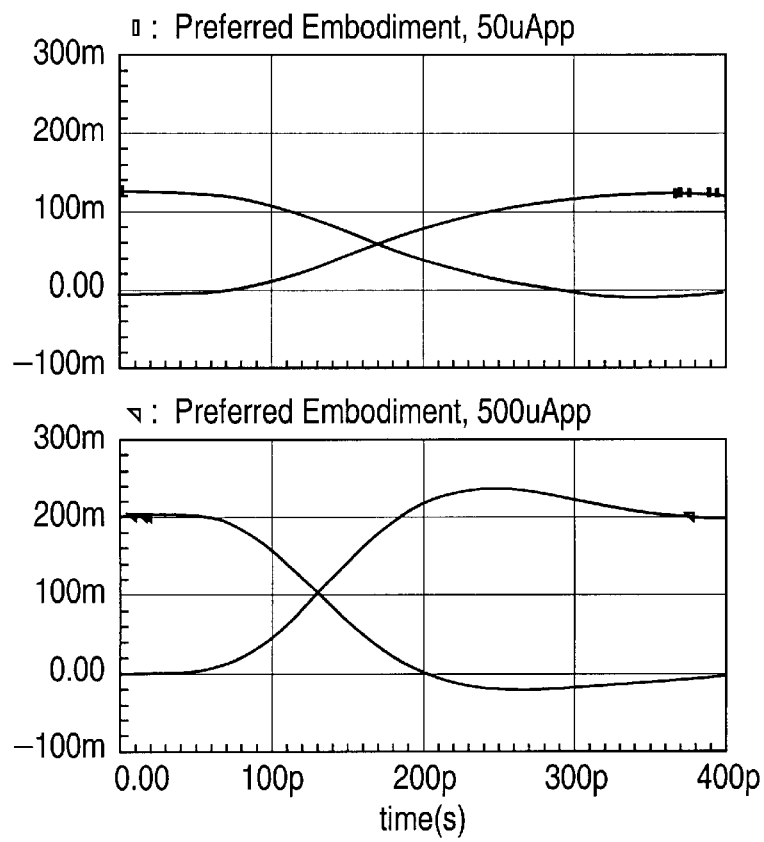
FIG. 13 is a graph showing the transient waveforms at the same two extremes of input amplitude but for the preferred embodiment.

Referring back to FIG. 11, the upper trace is proportional to the pole ratio for the preferred embodiment (FIG. 8). Once the AGC becomes active the pole ratio increases and peaks at around 1 mApp input current. The variation over the full range of input currents is significantly less than that for the prior art. This indicates a much more stable amplifier over the full range of input currents. This is further demonstrated by reference to FIG. 13 which plots the transient eye diagrams at a low input current (50 uApp) and a much higher 500 uApp. Like the prior art the 50 uApp waveform is stable with no overshoot or ringing. However, unlike the prior art, the 500 uApp waveform is also quite stable—with no ringing and minimal overshoot.

Figure 14:
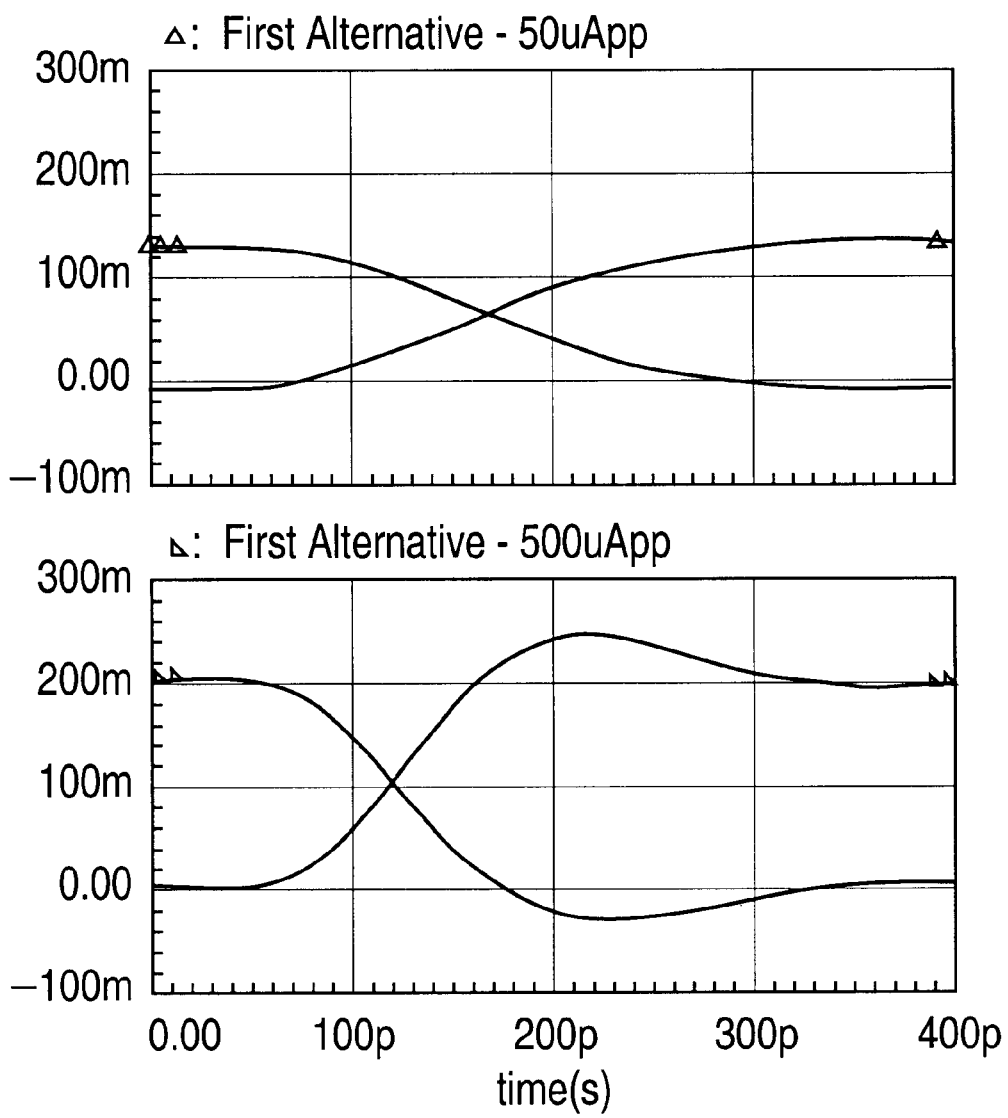
FIG. 14 is a graph showing the transient waveforms at the same two extremes of input amplitude but for the first alternative.

Finally, referring back to FIG. 11 again, the middle trace is proportional to first alternative (FIG. 10) pole ratio. This trace has less variation than either of the other two. Again it can be demonstrated that this circuit is stable by examining the graph in FIG. 14 where, as with the previous two cases, the 50 uApp trace shows no overshoot or ringing and typifies the output from a stable amplifier. The higher input current (500 uApp) trace is also stable—with no ringing and slight overshoot.

Although the present invention has been described herein primarily with reference to amplification applications in optical transducers, the present invention has wide applicability in any circuit benefiting from stability, particularly in circuits having inputs over a wide dynamic range.

Obviously, numerous modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. An automatic gain control (AGC) circuit, comprising:
   a gain stage having,
   a gain stage amplifier coupled to an input of the AGC circuit,
   a gain stage current source configured to bias the gain stage amplifier, and
   a gain control mechanism coupled to the gain stage amplifier and configured to vary a gain of the gain stage amplifier; and
   a gain control circuit having an input coupled to an output of the gain stage amplifier and configured to produce a gain control voltage based on the output of the gain stage amplifier, said gain control voltage is coupled to the gain control mechanism and used to adjust the gain of the gain control mechanism;
   wherein:
   said gain stage amplifier is a transistor having a gate connected to the input of the AGC circuit;
   said gain control mechanism is a variable feedback resistor having an amount of resistance controlled by the output voltage of said gain control circuit;
   said variable feedback resistor comprises a FET transistor in parallel with a resistor, a gate of the FET connected to the output voltage of said gain control circuit; and
   said variable feedback resistor connected between a collector and base of said gain stage amplifier.

2. The AGC circuit according to claim 1, wherein:
   said gain control circuit comprises,
   a peak detector coupled to an output of said gain stage and configured to detect a peak output of said gain stage amplifier, and
   a comparator configured to compare the peak output to a gain control reference voltage and apply an output of the comparison to the gain control mechanism.

3. The AGC circuit according to claim 2, further comprising:
   a dummy gain stage having gain characteristics similar to said gain stage and configured to produce a gain stage reference voltage at an output of the dummy stage, including,
   a dummy amplifier,
   a dummy current source configured to bias the dummy amplifier, and
   a dummy gain control mechanism coupled to the dummy amplifier and configured to vary the gain of the dummy amplifier;
   wherein:
   said peak detector is also coupled to the output of the dummy gain stage and said peak detector is configured to detect said peak output by a comparison of the gain stage output and the dummy gain stage output; and
   said gain control circuit is also configured to adjust the gain of the dummy gain stage variable gain control mechanism.

4. The AGC circuit according to claim 1, further comprising a gain stage compensation circuit configured to reduce bias current of the gain stage amplifier at input signal levels above a predetermined threshold.

5. An automatic gain control (AGC) circuit, comprising:
   a gain stage having,
   a gain stage amplifier coupled to an input of the AGC circuit,
   a gain stage current source configured to bias the gain stage amplifier, and
   a gain control mechanism coupled to the gain stage amplifier and configured to vary a gain of the gain stage amplifier; and
   a gain control circuit having an input coupled to an output of the gain stage amplifier and configured to produce a gain control voltage based on the output of the gain stage amplifier, said gain control voltage is coupled to the gain control mechanism and used to adjust the gain of the gain control mechanism;
   wherein:
   said gain control circuit comprises,
   a peak detector coupled to an output of said gain stage and configured to detect a peak output of said gain stage amplifier, and
   a comparator configured to compare the peak output to a gain control reference voltage and apply an output of the comparison to the gain control mechanism;
   said AGC circuit further comprising:
   a dummy gain stage having gain characteristics similar to said gain stage and configured to produce a gain stage reference voltage at an output of the dummy stage, including,
   a dummy amplifier,
   a dummy current source configured to bias the dummy amplifier, and
   a dummy gain control mechanism coupled to the dummy amplifier and configured to vary the gain of the dummy amplifier;
   wherein:
   said peak detector is also coupled to the output of the dummy gain stage and said peak detector is configured to detect said peak output by a comparison of the gain stage output and the dummy gain stage output; and said gain control circuit is also configured to adjust the gain of the dummy gain stage variable gain control mechanism;

said AGC circuit further comprising a gain compensation circuit configured to reduce bias current in each of said gain stage amplifier and a corresponding dummy gain stage amplifier in said dummy gain stage based on the gain control voltage.

6. The AGC circuit according to claim 5, wherein:

said gain compensation circuit comprises, a gain stage replica comprising a replica of the gain stage;

an amplifier configured to, measure a voltage of a component of the gain stage replica having properties representing an amount of gain adjustment from the gain control circuit, and provide an adjustment voltage reflecting a difference between a set voltage and the measured voltage;

a feedback network configured to provide a component current to said component based on the adjustment voltage; and a current device configured to provide bias reduction currents similar to said component current to each of said gain stage and dummy gain stage.

7. The AGC according to claim 6, wherein said amplifier comprises a current conveyor.

8. The AGC according to claim 6, wherein:

a first of the bias reduction currents is coupled to the gain control mechanism and gain stage amplifier at the input of the AGC and configured to draw bias current through the gain control mechanism; and a second of the bias reduction currents is coupled to the dummy gain control mechanism and dummy amplifier and configured to draw bias current through the dummy gain control mechanism.

9. The AGC circuit according to claim 6, wherein said component comprises a variable feedback resistor of the replica gain stage.

10. A method of controlling a gain of a gain staga amplifier over a wide dynamic range of inputs applied to the gain stage amplifier, comprising the steps of:

determining a gain control signal based on an output of the gain stage amplifier; and varying an amount of gain of the gain stage amplifier by, varying an amount of feedback from an output of the gain stage amplifier to an input of the gain stage amplifier based on the gain control signal, and reducing a bias current of the gain stage amplifier based on the gain control signal.

11. The method according to claim 10, wherein:

said step of determining a gain control signal comprises the steps of, detecting a peak voltage level between the gain stage amplifier and a dummy gain amplifier similarly set up as said gain stage amplifier without the applied inputs; and comparing the peak voltage level with a reference voltage to produce the gain control signal; and said method further comprises the step of applying the gain control signal to a variable feedback device that varies the amount of feedback.

12. The method according to claim 11, wherein said step of applying comprises applying the compared voltage to a gate of a FET in parallel with a feedback resistor of the gain stage amplifier.

13. The method according to claim 11, wherein said step of reducing a bias current of the gain stage amplifier comprises:

applying the compared voltage to a variable voltage device that adjusts an amount of output current from a current device;

inputting the output of the current device as a source for a double current mirror;

applying the first mirrored current to draw current from said bias current of said gain stage amplifier; and applying the second mirrored current to draw current from a bias current of said dummy gain amplifier.

14. An automatic gain control (AGC) circuit, comprising:

means for producing a gain control signal based on an output of the gain stage amplifier;

means for varying an amount of gain of the gain stage amplifier, including, means for varying an amount of feedback from an output of the gain stage amplifier to an input of the gain stage amplifier based on the gain control signal, and means for reducing a bias current of the gain stage amplifier based on the gain control signal.

15. The AGC according to claim 14, wherein:

said means for producing comprises, means for detecting a peak voltage level between the gain stage amplifier and a dummy gain amplifier similarly set up as said gain stage amplifier without the applied inputs, and means for comparing the peak voltage level with a reference voltage; and said means for varying an amount of feedback comprises means for applying the compared voltage to a variable feedback device that varies the amount of feedback.

16. The AGC according to claim 14, wherein:

said means for producing comprises, means for detecting a peak voltage level between the gain stage amplifier and a dummy gain amplifier similarly set up as said gain stage amplifier without the applied inputs, and means for comparing the peak voltage level with a reference voltage; and said means for reducing comprises, means for applying the compared voltage to a variable voltage device that adjusts an amount of output current from a current device, means for inputting the output of the current device as a source for a current mirror, and means for applying the mirrored current to draw current from said bias current.

17. An AGC circuit, comprising:

a gain stage amplifier biased by a bias current and having an input coupled to an input of the AGC circuit;

a feedback device coupled between an output of the gain stage amplifier and the input of the gain stage amplifier and configured to feedback a portion of an output signal of the gain stage amplifier to the input of the gain stage amplifier;

a gain control circuit configured to produce a feedback control signal based on the output signal of the gain stage amplifier, said feedback control signal coupled to the feedback device, a gain stage compensation circuit configured to drain a portion of the gain stage amplifier bias current;

wherein the feedback device is configured to regulate the portion of said output signal fed back into the input of the gain stage amplifier and regulate the portion of bias current drained from the gain stage amplifier based on the feedback control signal.

18. The AGC circuit according to claim 17, further comprising:

a dummy gain stage amplifier and a dummy feedback device configured similarly to corresponding components of the gain stage amplifier and feedback device;

a differential voltage buffer, having a first input coupled to an output of the gain stage amplifier and a second input coupled to an output of the dummy gain stage amplifier, said differential buffer configured to buffer the gain stage and dummy gain stage outputs providing them to the gain control circuit;

wherein:

said gain control circuit produces said feedback control signal based on the gain stage and dummy stage buffered outputs; and said feedback control signal is further coupled to the dummy feedback device to regulate an amount of an output signal from the dummy gain stage amplifier is fed back into an input of the dummy gain stage amplifier.

19. The AGC circuit according to claim 18, wherein:

said differential voltage buffer comprises, a first differential transistor having, a base connected to an output of the gain stage, an collector connected to a first resistive current source, and an emitter connected to an active current source and a first end of an emitter degeneration resistor; and a second differential transistor having, a base connected to an output of the dummy gain stage, a collector connected to a second resistive current source, and an emitter connected to a second active current source and a second end of the emitter degeneration resistor;

wherein the collectors of the differential transistors are coupled to inputs of the gain control circuit and signals provided thereby are used to produce said gain control voltage.

20. The AGC according to claim 19, further comprising:

a first level shift diode coupled between the gain stage amplifier and said gain stage current source, the base of the first differential transistor also coupled at the juncture of the first level shift diode and said gain stage current source; and a second level shift diode coupled between the dummy gain stage amplifier and said dummy gain stage current source, the base of the second differential transistor also coupled at the juncture of the second level shift diode and said dummy gain stage current source.

21. The AGC circuit according to claim 18, wherein:

said differential voltage buffer comprises, a first differential transistor having, a base connected to an output of the gain stage amplifier, a collector connected to a first resistive current source, an emitter connected to a first end of a first resistor, and a second end of the first resistor connected to ground; and a second differential transistor having, a base connected to an output of the dummy gain stage, a collector connected to a second resistive current source, an emitter connected to one end of a second resistor, and a second end of the second resistor connected to ground;

wherein the collectors of the differential transistors are coupled to inputs of the gain control circuit and signals provided thereby are used to produce said gain control voltage.

22. The AGC circuit according to claim 17, further comprising:

a dummy gain stage amplifier;

a dummy feedback device configured to feed at least part of an output signal of the dummy gain stage amplifier to an input of the dummy gain stage amplifier; and wherein:

the feedback control signal is based on the outputs of the gain stage amplifier and dummy gain stage amplifier; and the gain stage compensation circuit is configured to drain bias currents from each of the gain stage amplifier and dummy gain stage amplifier based on the feedback control signal.

23. The AGC circuit according to claim 22, wherein:

said gain stage compensation circuit comprises, a current mirror having an input current part and a mirrored current part, said mirrored current part is connected to the collector of said gain stage amplifier, a mirror driving circuit coupled to said input current part, and a gain compensation controller connected to said mirror driving circuit and configured to regulate an amount of current provided by the mirror driving circuit to the input current part of the current mirror based on the feedback control signal.

24. The AGC circuit according to claim 23, wherein said mirror driving circuit comprises a driving transistor connected to a current input of the current mirror, said driving transistor turned more on or more off and thereby regulating the amount of current flowing through said input current part based on said gain compensation controller.

25. The AGC circuit according to claim 24, wherein said gain compensation controller comprises a scaled replica of the feedback device configured to produce a voltage level connected to a base of the driving transistor, said voltage level based on the output of the gain control circuit.

26. The AGC circuit according to claim 24, wherein:

said gain compensation controller comprises, a driving variable resistor connected at one end to a current source and a base of the driving transistor and connected at a second end to a reference level voltage, a resistance amount of said driving variable resistor being controlled by the feedback control signal.

27. The AGC circuit according to claim 26, wherein:

said driving variable resistor is a FET in parallel with a fixed resistor and having a gate of the FET connected to the output of said gain control circuit.

28. The AGC circuit according to claim 24, wherein:

a collector of the driving transistor is connected to a second current source and the input of the current mirror;

an emitter of the driving transistor connected to a reference voltage.

29. The AGC circuit according to claim 26, wherein said reference voltage is ground.

* * * * *